United States Patent
Funaki et al.

(10) Patent No.: US 8,804,240 B2
(45) Date of Patent: Aug. 12, 2014

(54) GARNET-TYPE SINGLE CRYSTAL, OPTICAL ISOLATOR AND LASER PROCESSING MACHINE

(71) Applicants: Fujikura LTD., Tokyo (JP); National Institute for Materials Science, Tsukuba (JP)

(72) Inventors: Akiharu Funaki, Chiba (JP); Tsubasa Hatanaka, Ibaraki (JP); Kiyoshi Shimamura, Ibaraki (JP); Villora Encarnacion Antonia Garcia, Ibaraki (JP)

(73) Assignees: Fujikura Ltd., Tokyo (JP); National Institute for Materials Science, Tsukuba-shi (JP)

( * ) Notice: Subject to any disclaimer, the term of this patent is extended or adjusted under 35 U.S.C. 154(b) by 0 days.

(21) Appl. No.: 13/750,075

(22) Filed: Jan. 25, 2013

(65) Prior Publication Data

US 2013/0135724 A1 May 30, 2013

Related U.S. Application Data

(63) Continuation of application No. PCT/JP2011/066665, filed on Jul. 22, 2011.

(30) Foreign Application Priority Data

Jul. 26, 2010 (JP) .................................. 2010-166663

(51) Int. Cl.
*G02B 27/28* (2006.01)

(52) U.S. Cl.
CPC .................................. *G02B 27/281* (2013.01)
USPC ....................... 359/484.03; 359/352; 252/585

(58) Field of Classification Search
CPC ......... G02B 5/30; G02B 5/3025; G02B 27/28; G02B 27/281; G02B 2006/12157
USPC ....................... 359/352, 484.03; 252/584, 585
See application file for complete search history.

(56) References Cited

U.S. PATENT DOCUMENTS

| 6,373,876 | B1 * | 4/2002 | Dulaney et al. | 372/98 |
| 7,259,913 | B2 * | 8/2007 | Iida | 359/484.03 |
| 2007/0091950 | A1 * | 4/2007 | Takata et al. | 372/39 |
| 2007/0238604 | A1 | 10/2007 | Tang et al. | |
| 2008/0123698 | A1 * | 5/2008 | Takata et al. | 372/22 |

FOREIGN PATENT DOCUMENTS

| EP | 2492379 A1 | 8/2012 |
| EP | 2562296 A1 | 2/2013 |
| JP | 2002-293693 A | 10/2002 |
| WO | 2011049102 A1 | 4/2011 |

OTHER PUBLICATIONS

D.A Pawlak, et al., "Growth of Tb-Sc-Al garnet single crystals by the micro-pulling down method", Journal of Crystal Growth, Jun. 2001, pp. 341-347, vol. 226.

A. Yoshikawa, et al., "Czochralski growth of $Tb_3Sc_2Al_{33}O_{12}$ single crystal for Faraday rotator", Materials Research Bulletin, 2002, pp. 1-10, vol. 37.

Extended European Search Report issued Dec. 17, 2013 in European Patent Application No. 11812386.8.

* cited by examiner

*Primary Examiner* — Frank Font
(74) *Attorney, Agent, or Firm* — Sughrue Mion, PLLC

(57) ABSTRACT

The present invention is a garnet-type single crystal represented by the following general formula:

$$(Tb_{3-x}Sc_x)(Sc_{2-y}Al_y)Al_3O_{12-z} \quad (1)$$

(wherein, x satisfies 0<x<0.1).

8 Claims, 3 Drawing Sheets

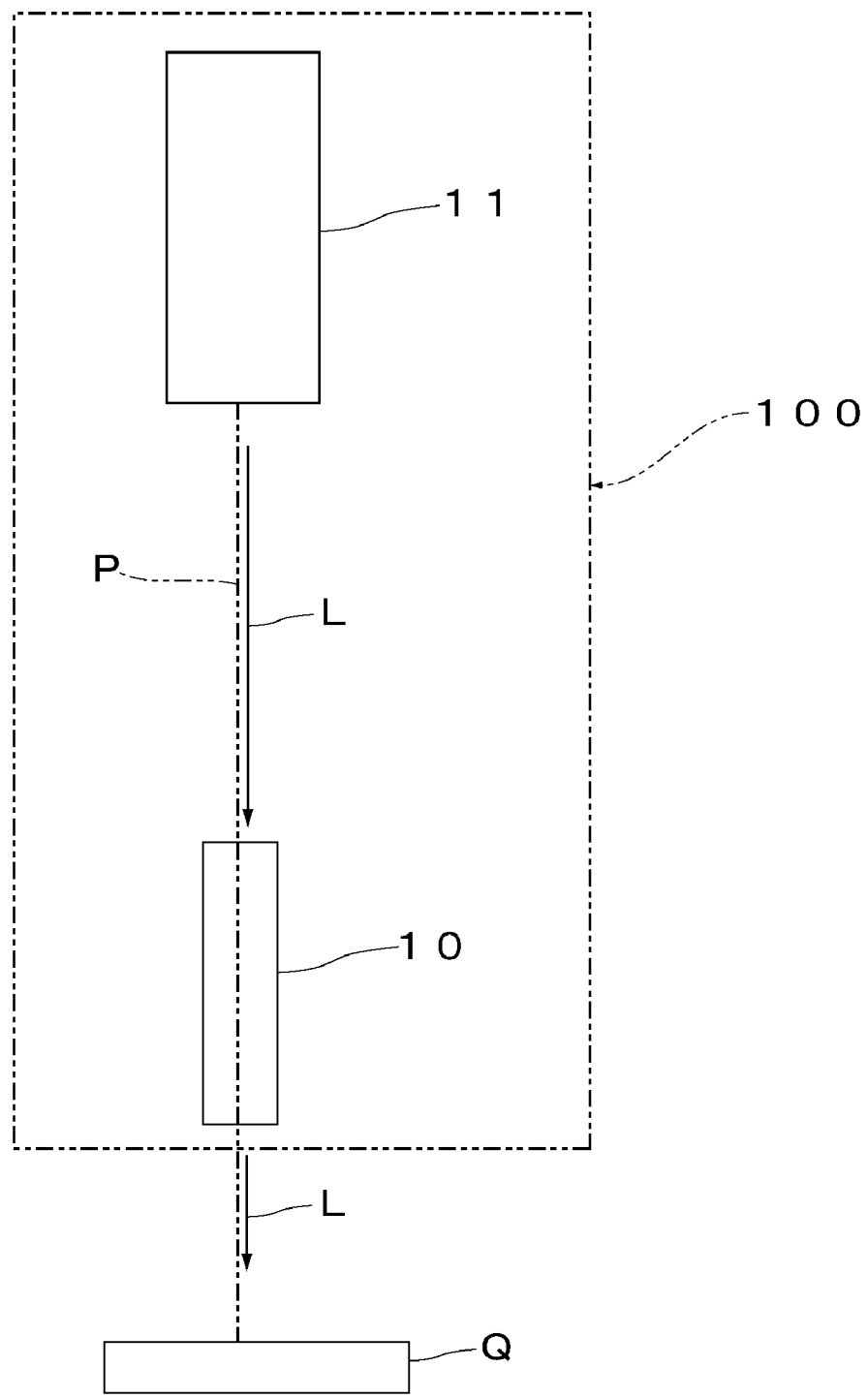

GARNET-TYPE SINGLE CRYSTAL, OPTICAL ISOLATOR AND LASER PROCESSING MACHINE

CROSS REFERENCE TO RELATED APPLICATIONS

This application is a Continuation of National Stage of International Application No. PCT/JP2011/066665 filed Jul. 22, 2011, claiming priority based on Japanese Patent Application No. 2010-166663 filed Jul. 26, 2010, the contents of all of which are incorporated herein by reference in their entirety.

TECHNICAL FIELD

The present invention relates to a garnet-type single crystal, an optical isolator and a laser processing machine.

BACKGROUND ART

Optical isolators have a Faraday rotator that rotates the plane of polarization of incident light by applying a magnetic field, and in recent years, have come to be used in not only optical communications, but in laser processing machines as well.

Terbium-scandium-aluminum-garnet-type single crystals (TSAG: $Tb_3Sc_2Al_3O_{12}$) have conventionally been known as Faraday rotators used in such optical isolators (refer to the following Non-Patent Document 1).

PRIOR ART DOCUMENTS

Non-Patent Documents

Non-Patent Document 1: Yoshikawa and 5 others. Crochralski Growth of $Tb_3Sc_2Al_3O_{12}$ Single Crystal for Faraday Rotator, Materials Research Bulletin, 2001, Vol. 37, pp. 1-10

SUMMARY OF THE INVENTION

Problem to be Solved by the Invention

However, although the garnet-type single crystal described in the above-mentioned Non-Patent Document 1 has transparency, there were cases in which cracks formed in the single crystal.

With the foregoing in view, an object of the present invention is to provide a garnet-type single crystal having transparency and able to adequately inhibit the formation of cracks, an optical isolator, and a laser processing machine.

Means for Solving the Problem

As a result of conducting extensive studies to solve the above-mentioned problems, the inventors of the present invention found that the above-mentioned problems can be solved by substituting a portion of the Tb in the single crystal described in Non-Patent Document 1 with Sc, thereby leading to completion of the present invention.

Namely, the present invention is a garnet-type single crystal represented by the following general formula:

$$(Tb_{3-x}Sc_x)(Sc_{2-y}Al_y)Al_3O_{12-z} \quad (1)$$

(wherein, x satisfies 0<x<0.1).

This single crystal has transparency and is able to adequately inhibit the formation of cracks. The inventors of the present invention presumed that the reason why the formation of cracks is adequately inhibited is because the garnet structure is stabilized as a result of substituting a portion of the Tb with Sc.

In addition, the above-mentioned garnet-type single crystal is preferably used for a Faraday rotator.

In the above-mentioned general formula (1), y and z preferably simultaneously satisfy the formulas indicated below.

$$0 \leq y \leq 0.2$$

$$0 \leq z \leq 0.3$$

In this case, in comparison with the case of y and z being outside the above-mentioned ranges, decreases in transmittance of the single crystal can be more adequately inhibited.

In the above-mentioned general formula (1), x, y and z more preferably satisfy the formulas indicated below.

$$0.05 \leq x \leq 0.07$$

$$0.07 \leq y \leq 0.11$$

$$0.08 \leq z \leq 0.12$$

A single crystal that satisfies the above-mentioned formulas has a larger Verdet's constant at a wavelength of 1064 nm. Consequently, a garnet-type single crystal that satisfies the above-mentioned formulas is extremely useful as a single crystal for a Faraday rotator used in an optical isolator of a laser processing machine that uses an Nd:YAG laser for the light source thereof.

In addition, the present invention is an optical isolator having a Faraday rotator, and is an optical isolator in which the above-mentioned Faraday rotator is formed of the above-mentioned garnet-type single crystal.

In the optical isolator of the present invention, since the Faraday rotator is formed of the above-mentioned garnet-type single crystal, and Faraday rotators can be obtained in large amounts from the above-mentioned single crystal, the cost of the Faraday rotator can be reduced. Thus, costs can be reduced by using the optical isolator of the present invention.

Moreover, the present invention is a laser processing machine having the above-mentioned optical isolator.

According to the laser processing machine of the present invention, since the garnet-type single crystal is transparent, absorption of light by the garnet-type single crystal is low. Consequently, resistance of the optical isolator to damage caused by light can be enhanced. Moreover, since lattice defects and the like within the crystal can be inhibited, the formation of cracks can be prevented. Thus, the service life of the optical isolator can be extended. As a result, the replacement frequency of the optical isolator in the laser processing machine can be decreased.

Effects of the Invention

According to the present invention, a garnet-type single crystal, which has transparency and is adequately able to inhibit the formation of cracks, an optical isolator, and a laser processing machine, are provided.

BRIEF DESCRIPTION OF THE DRAWINGS

FIG. 3 is a schematic drawing showing an embodiment of a laser processing machine according to the present invention.

MODE FOR CARRYING OUT THE INVENTION

The following provides a detailed explanation of embodiments of the present invention with reference to the drawings.

Figure 1:
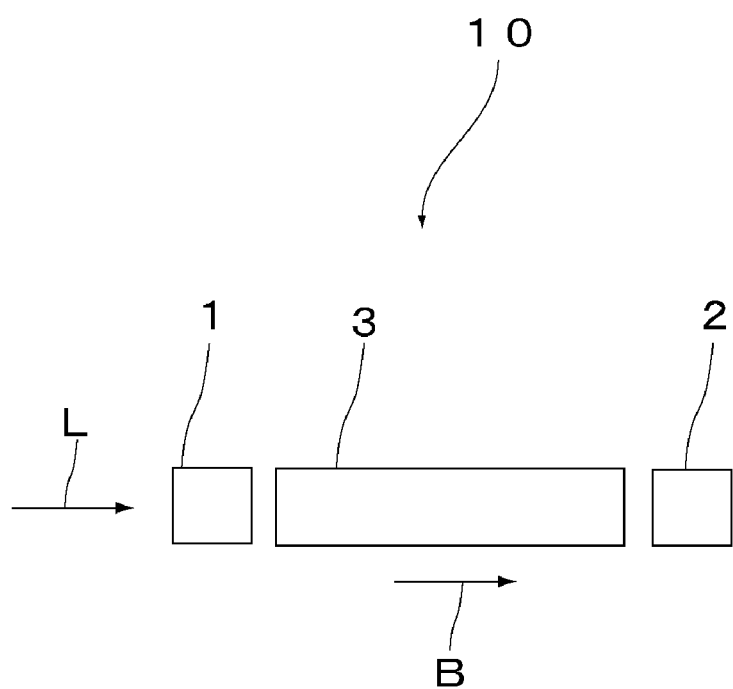
FIG. 1 is a drawing showing an embodiment of an optical isolator according to the present invention.

FIG. 1 is a drawing showing an embodiment of an optical isolator of the present invention. As shown in FIG. 1, an optical isolator 10 is provided with a polarizer 1, an analyzer 2, and a Faraday rotator 3 arranged between the polarizer 1 and the analyzer 2. Here, the polarizer 1 and the analyzer 2 are arranged so that their transmission axes are mutually non-parallel, and are arranged at an angle of, for example, 45°.

A magnetic field B is applied to the Faraday rotator 3 in, for example, the direction from the polarizer 1 towards the analyzer 2, or in other words, the direction at which light enters, and the Faraday rotator 3 is such that, as a result of the application of the magnetic field B, the plane of polarization of transmitted light L that has passed through the polarizer 1 is rotated so as to cause it to pass through the transmission axis of the analyzer 2.

The following provides a detailed explanation of the Faraday rotator 3.

The Faraday rotator 3 is composed with a garnet-type single crystal for a Faraday rotator represented by the following general formula:

$$(Tb_{3-x}Sc_x)(Sc_{2-y}Al_y)Al_3O_{12-z} \quad (1)$$

(wherein, x satisfies 0<x<0.1). Here, the single crystal represented by the above-mentioned general formula (1) represents a terbium-scandium-aluminum-garnet-type single crystal. In the case the single crystal represented by the above-mentioned general formula (1) is based on $Tb_3Sc_2Al_3O_{12}$, then the moiety $(Sc_{2-y}Al_y)$ indicates that a portion of the Sc can be substituted with Al, while the $(Tb_{3-x}Sc_x)$ moiety indicates that a portion of the Tb is substituted with Sc. According to the garnet-type single crystal represented by the above-mentioned general formula (1), the single crystal has transparency at least in wavelength regions of infrared light and visible light, and is able to adequately inhibit the formation of cracks when cut.

In the above-mentioned general formula (1), x satisfies 0<x<0.1. If x is zero, cracks form in the single crystal when the single crystal is cut. If x is 0.1 or more, a second phase crystallizes in the crystal, thereby preventing realization of a single crystal. x is preferably 0.04 to 0.09.

In the above-mentioned general formula (1), y is normally 0 to 0.2 and preferably 0.02 to 0.2.

In the above-mentioned general formula (1), z is normally 0 to 0.3 and preferably 0 to 0.2. Furthermore, in the case z is not zero, the number of oxygen atoms becomes less than 12, which is the number of oxygen atoms in garnet-type single crystal, and this is caused by defects in the single crystal.

In particular, since decreases in transmittance caused by oxygen defects are more adequately inhibited, y and z preferably simultaneously satisfy the formulas indicated below in the above-mentioned general formula 1.

$$0 \le y \le 0.2$$

$$0 \le z \le 0.3$$

In particular, in order to further increase Verdet's constant in the case of using the Faraday rotator 3 in an optical isolator of a laser processing machine that uses an Nd:YAG laser (emission wavelength: 1064 nm) for the light source thereof, x, y and z preferably simultaneously satisfy the general formulas indicated below in the above-mentioned general formula (1).

$$0.05 \le x \le 0.07$$

$$0.07 \le y \le 0.11$$

$$0.08 \le z \le 0.12$$

The following provides an explanation of a method for growing the above-mentioned single crystal.

Figure 2:
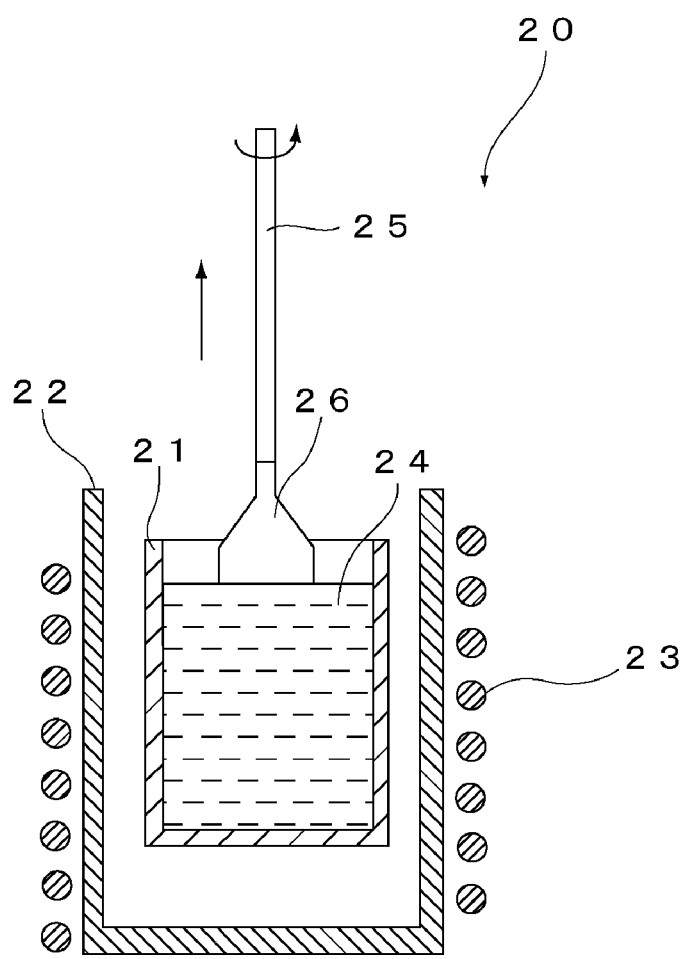
FIG. 2 is a process drawing showing a process for growing a garnet-type single crystal according to the present invention.

First, prior to explaining the method used to grow the single crystal, an explanation is provided of a crystal growth device used to grow the above-mentioned single crystal with reference to FIG. 2. FIG. 2 is a process drawing showing a process for growing a garnet-type single crystal for a Faraday rotator according to the present invention. As shown in FIG. 2, a crystal growth device 20 is mainly provided with an iridium crucible 21, a tubular vessel 22 made of ceramic that houses the crucible 21, and a high-frequency coil 23 wound around the periphery of the tubular vessel 22. The high-frequency coil 23 is used for heating the crucible 21 by generating an induced current in the crucible 21.

The following provides an explanation of a method for growing the above-mentioned single crystal using the crystal growth device 20 described above.

First, a $Tb_4O_7$ powder, $Sc_2O_3$ powder and $Al_2O_3$ powder are prepared.

Once the composition of the single crystal to be grown, namely x, y and z in the above-mentioned general formula (1), has been determined, the blending ratios of the $Tb_4O_7$ powder, $Sc_2O_3$ powder and $Al_2O_3$ powder are determined based on that composition. At this time, the above-mentioned $Tb_4O_7$ powder, $Sc_2O_3$ powder and $Al_2O_3$ powder are as indicated below.

Namely, the blending ratio of the $Tb_4O_7$ powder is normally 21.0 mol % to 23.1 mol % based on the total number of moles of the $Tb_4O_7$ powder, $Sc_2O_3$ powder and $Al_2O_3$ powder.

The blending ratio of the $Sc_2O_3$ powder is normally 30.8 mol % to 33.5 mol % based on the total number of moles of the $Tb_4O_7$ powder, $Sc_2O_3$ powder and $Al_2O_3$ powder.

The blending ratio of the $Al_2O_3$ powder is normally 45.0 mol % to 46.1 mol % based on the total number of moles of the $Tb_4O_7$ powder, $Sc_2O_3$ powder and $Al_2O_3$ powder. The above-mentioned $Tb_4O_7$ powder, $Sc_2O_3$ powder and $Al_2O_3$ powder are then dry-mixed in the determined blending ratios to obtain a mixed powder.

Next, the above-mentioned mixed powder is packed into the crucible 21.

Continuing, current is applied to the high-frequency coil 23. Whereupon, the crucible 21 is heated, and the mixed powder in the crucible 21 is melted to obtain a molten liquid 24. Continuing, a rod-shaped seed crystal 25 is prepared, and after immersing the end of the seed crystal 25 in the molten liquid 24, the seed crystal 25 is lifted up at a prescribed lifting speed while rotating the seed crystal 25 at a prescribed rotating speed.

At this time, a garnet-type single crystal such as yttrium-aluminum-garnet (YAG) can be used for the seed crystal 25.

The rotating speed of the seed crystal 25 is preferably 3 rpm to 50 rpm and more preferably 3 rpm to 10 rpm.

The lifting speed of the seed crystal 25 is preferably 0.1 mm/h to 3 mm/h and more preferably 0.2 mm/h to 1 mm/h.

The seed crystal 25 is preferably lifted out in an inert gas atmosphere, and nitrogen is normally used for the inert gas. In addition, the seed crystal 25 is normally lifted out at atmospheric pressure.

When the seed crystal 25 is lifted out in this manner, a bulk single crystal 26 represented by the above-mentioned general formula (1) can be obtained on the end of the seed crystal 25.

The following provides a detailed explanation of a laser processing machine of the present invention with reference to FIG. 3. Furthermore, in FIG. 3, the same reference symbols are used to indicate constituents that are the same as or equivalent to those of FIG. 1, and duplicate explanations thereof are omitted.

FIG. 3 is a schematic drawing showing an embodiment of the laser processing machine according to the present invention. As shown in FIG. 3, a laser processing machine 100 is provided with a laser light source 11, and the optical isolator 10 arranged in a light path P of laser light L emitted from the laser light source 11. According to this laser processing machine 100, laser light L emitted from the laser light source 11 is emitted through the optical isolator 10, thereby enabling processing of a processed article Q with this emitted light.

Here, since the garnet-type single crystal used for the Faraday rotator of the optical isolator 10 has transparency, there is little absorption of light by the garnet-type single crystal. Consequently, resistance to damage by light of the Faraday rotator 3 can be enhanced.

In addition, since the above-mentioned garnet-type single crystal used for the Faraday rotator 3 is able to inhibit lattice defects and the like within the crystal, the formation of cracks can be prevented. Consequently, the service life of the optical isolator 10 can be extended. As a result, the replacement frequency of the optical isolator 10 in the laser processing machine 100 can be decreased.

A laser light source such as an Nd:YAG laser having an emission wavelength of 1064 nm or more, or a Yb-doped fiber laser having an emission wavelength of 1080 nm, can be used for the laser light source 11. In addition, a laser light source having an emission wavelength of less than 1064 nm can also be used for the laser light source 11. An example of a laser light source having an emission wavelength of less than 1064 nm is a laser light source having an emission wavelength of 400 nm to 700 nm. Examples of laser light sources having an emission wavelength of 400 nm to 700 nm include a GaN-type semiconductor laser having an emission wavelength of 405 nm and a titanium-sapphire laser having an emission wavelength of 700 nm. Furthermore, the emission wavelength of the laser light source 11 may also be within the range of 700 nm to 1064 nm, such as in the vicinity of 800 nm, or from 1.030 nm to 1080 nm.

In addition, although a garnet-type single crystal is used in an optical isolator of a laser processing machine in the above-mentioned embodiment, use of the garnet-type single crystal is not limited to an optical isolator, but rather can also be applied to an optical magnetic field sensor and the like that is used to observe changes in a magnetic field by measuring changes in Faraday rotation angle using a Faraday rotator. In addition, the garnet-type single crystal can also be used in applications other than those of a Faraday rotator.

EXAMPLES

Although the following provides a more specific explanation of the contents of the present invention through examples thereof, the present invention is not limited to the following examples.

Example 1

First, $Tb_4O_7$ powder (purity: 99.99%), $Sc_2O_3$ powder (purity: 99.99%) and $Al_2O_3$ powder (purity: 99.99%) were prepared followed by dry mixing these powders to obtain a mixed powder. At this time, the blending ratios of the $Tb_4O_7$ powder, $Sc_2O_3$ powder and $Al_2O_3$ powder based on the total number of moles (100 mol %) of the $Tb_4O_7$ powder, $Sc_2O_3$ powder and $Al_2O_3$ powder were 23.1 mol %, 30.8 mol % and 46.1 mol %, respectively.

Continuing, the above-mentioned mixed powder was packed into the tubular crucible 21 having a diameter of 50 mm and depth of 50 mm.

Next, current was applied to the high-frequency coil 23 to melt the mixed powder and obtain the molten liquid 24. Continuing, the seed crystal 25 in the form of a square rod measuring 3 mm×3 mm×70 mm and composed of YAG (yttrium-aluminum-garnet) was prepared, and after immersing the end of the seed crystal 25 in the molten liquid 24, the seed crystal 25 was lifted out at a lifting speed of 1 mm/h while rotating at a rotating speed of 10 rpm. At this time, nitrogen was allowed to flow into the tubular vessel 22 at a flow rate of 2 L/min, and the seed crystal 25 was lifted out in a nitrogen atmosphere at atmospheric pressure. A transparent single crystal having a diameter of about 2.5 cm and length of about 5 cm was obtained in this manner.

When the single crystal obtained in this manner was subjected to X-ray diffraction, peaks corresponding to $Tb_3Sc_2Al_3O_{12}$ were confirmed. In addition, as a result of conducting a structural analysis of the resulting single crystal by single crystal X-ray diffraction using Smart Apex manufactured by Bruker AXS K.K., a portion of the Tb was confirmed to have been substituted with Sc, a portion of the Sc was confirmed to have been substituted with Al, and a portion of the oxygen atoms were confirmed to have been lost.

Moreover, the composition of the single crystal (atomic ratios of Tb, Sc, Al and O) was confirmed by chemical analysis of the above-mentioned single crystal by inductively coupled plasma (ICP). More specifically, chemical analysis by ICP was carried out in the manner described below. Namely, a section of the single crystal was obtained by cutting out 50 mg from the lower end of the linear midsection of the single crystal. Next, the section was placed in a platinum crucible, and 250 mg of lithium tetraborate was added thereto. Then, the platinum crucible was placed in a high-temperature heating furnace followed by heating for 2 hours at 1030° C. to melt the single crystal section. Subsequently, after allowing the platinum crucible to cool, the section was placed in a 50 ml beaker and 120 ml of HCl were added thereto. Next, the beaker was placed on a hot plate and gently heated to dissolve each elementary constituent (Tb, Sc and Al) from the section in the HCl. At this time, the resulting solution in the beaker was measured to a volume of 50 ml in a graduated cylinder, and chemical analysis by ICP was carried out on this solution. As a result, a single crystal was confirmed to have been obtained that had a composition of $(Tb_{2.96}Sc_{0.04})(Sc_{1.87}Al_{0.13})Al_3O_{11.9}$.

Example 2

First, $Tb_4O_7$ powder (purity: 99.99%), $Sc_2O_3$ powder (purity: 99.990) and $Al_2O_3$ powder (purity: 99.99%) were prepared followed by dry mixing these powders to obtain a mixed powder. At this time, the blending ratios of the $Tb_4O_7$ powder, $Sc_2O_3$ powder and $Al_2O_3$ powder based on the total number of moles (100 mol %) of the $Tb_4O_7$ powder, $Sc_2O_3$ powder and $Al_2O_3$ powder were 22.1 mol %, 32.1 mol % and 45.8 mol %, respectively.

Continuing, the above-mentioned mixed powder was packed into the tubular crucible 21 having a diameter of 50 mm and depth of 50 mm.

A single crystal was subsequently grown in the same manner as Example 1. A transparent single crystal having a diameter of about 2.5 cm and length of about 5 cm was obtained in this manner.

When the single crystal obtained in this manner was subjected to X-ray diffraction, peaks corresponding to $Tb_3Sc_2Al_3O_{12}$ were confirmed. In addition, as a result of conducting a structural analysis of the resulting single crystal by single crystal X-ray diffraction, a portion of the Tb was confirmed to have been substituted with Sc, a portion of the Sc was confirmed to have been substituted with Al, and a portion of the oxygen atoms were confirmed to have been lost.

Moreover, when the single crystal was subjected to chemical analysis by ICP in the same manner as Example 1, a single crystal was confirmed to have been obtained that had a composition of $(Tb_{2.94}Sc_{0.06})(Sc_{1.91}Al_{0.09})Al_3O_{11.9}$.

Example 3

First, $Tb_4O_7$ powder (purity: 99.99%), $Sc_2O_3$ powder (purity: 99.99%) and $Al_2O_3$ powder (purity: 99.99%) were prepared followed by dry mixing these powders to obtain a mixed powder. At this time, the blending ratios of the $Tb_4O_7$ powder, $Sc_2O_3$ powder and $Al_2O_3$ powder based on the total number of moles (100 mol %) of the $Tb_4O_7$ powder, $Sc_2O_3$ powder and $Al_2O_3$ powder were 21.2 mol %, 33.3 mol % and 45.5 mol %, respectively.

Continuing, the above-mentioned mixed powder was packed into the tubular crucible 21 having a diameter of 50 mm and depth of 50 mm.

A single crystal was subsequently grown in the same manner as Example 1. A transparent single crystal having a diameter of about 2.5 cm and length of about 5 cm was obtained in this manner.

When the single crystal obtained in this manner was subjected to X-ray diffraction, peaks corresponding to $Tb_3Sc_2Al_3O_{12}$ were confirmed. In addition, as a result of conducting a structural analysis of the resulting single crystal by single crystal X-ray diffraction, a portion of the Tb was confirmed to have been substituted with Sc, a portion of the Sc was confirmed to have been substituted with Al, and a portion of the oxygen atoms were confirmed to have been lost.

Moreover, when the single crystal was subjected to chemical analysis by ICP in the same manner as Example 1, a single crystal was confirmed to have been obtained that had a composition of $(Tb_{2.91}Sc_{0.09})(Sc_{1.97}Al_{0.03})Al_3O_{11.9}$.

Example 4

First, $Tb_4O_7$ powder (purity: 99.99%), $Sc_2O_3$ powder (purity: 99.99%) and $Al_2O_3$ powder (purity: 99.99%) were prepared followed by dry mixing these powders to obtain a mixed powder. At this time, the blending ratios of the $Tb_4O_7$ powder, $Sc_2O_3$ powder and $Al_2O_3$ powder based on the total number of moles (100 mol %) of the $Tb_4O_7$ powder, $Sc_2O_3$ powder and $Al_2O_3$ powder were 22.6 mol %, 31.4 mol % and 46.0 mol %, respectively.

Continuing, the above-mentioned mixed powder was packed into the tubular crucible 21 having a diameter of 50 mm and depth of 50 mm.

A single crystal was subsequently grown in the same manner as Example 1. A transparent single crystal having a diameter of about 2.5 cm and length of about 5 cm was obtained in this manner.

When the single crystal obtained in this manner was subjected to X-ray diffraction, peaks corresponding to $Tb_3Sc_2Al_3O_{12}$ were confirmed. In addition, as a result of conducting a structural analysis of the resulting single crystal by single crystal X-ray diffraction, a portion of the Tb was confirmed to have been substituted with Sc, a portion of the Sc was confirmed to have been substituted with Al, and a portion of the oxygen atoms were confirmed to have been lost.

Moreover, when the single crystal was subjected to chemical analysis by ICP in the same manner as Example 1, a single crystal was confirmed to have been obtained that had a composition of $(Tb_{2.99}Sc_{0.01})(Sc_{1.85}Al_{0.15})Al_3O_{11.9}$.

Comparative Example 1

First, $Tb_4O_7$ powder (purity: 99.99%), $Sc_2O_3$ powder (purity: 99.99%) and $Al_2O_3$ powder (purity: 99.99%) were prepared followed by dry mixing these powders to obtain a mixed powder. At this time, the blending ratios of the $Tb_4O_7$ powder, $Sc_2O_3$ powder and $Al_2O_3$ powder based on the total number of moles (100 mol %) of the $Tb_4O_7$ powder, $Sc_2O_3$ powder and $Al_2O_3$ powder were 22.7 mol %, 31.3 mol % and 46.0 mol %, respectively.

Continuing, the above-mentioned mixed powder was packed into the tubular crucible 21 having a diameter of 50 mm and depth of 50 mm.

A single crystal was subsequently grown in the same manner as Example 1. A transparent single crystal having a diameter of about 2.5 cm and length of about 5 cm was obtained in this manner.

When the single crystal obtained in this manner was subjected to X-ray diffraction, peaks corresponding to $Tb_3Sc_2Al_3O_{12}$ were confirmed. In addition, as a result of conducting a structural analysis of the resulting single crystal by single crystal X-ray diffraction, a portion of the Sc was confirmed to have been substituted with Al, and a portion of the oxygen atoms were confirmed to have been lost.

Moreover, when the single crystal was subjected to chemical analysis by ICP in the same manner as Example 1, a single crystal was confirmed to have been obtained that had a composition of $Tb_3(Sc_{1.85}Al_{0.15})Al_3O_{11.8}$.

[Evaluation of Properties]

(1) Presence of Cracks

A crystal ingot having a thickness of about 2 cm was cut out of the single crystals of Examples 1 to 4 and Comparative Example 1 with an inner diameter blade cutting machine equipped with an electrodeposited diamond blade, and the resulting single crystals were visually examined for the presence of cracks during cutting. The results are shown in Table 1.

(2) Faraday Rotation Angle

Faraday rotation angles at wavelengths of 633 nm, 1064 nm and 1303 nm were measured for the single crystals of Examples 1 to 4 and Comparative Example 1 obtained in the manner described above. Faraday rotation angles were measured in the manner described below. Namely, the analyzer was rotated without arranging a single crystal between the polarizer and analyzer to create a quenched state. Next, the single crystals of Examples 1 to 4 and Comparative Example 1 were cut into the shape of square rods measuring 3.5 mm×3.5 mm×20 mm, each single crystal was placed between the polarizer and analyzer, and light was emitted while applying magnetic flux density of 0.42 T along the lengthwise direction of the single crystal followed by again rotating the analyzer to create a quenched state. The difference between the rotation angle of the analyzer prior to interposing the single crystal between the polarizer and analyzer and the rotation angle of the analyzer after interposing the single crystal therebetween was calculated, and this difference in rotation angles was taken to be the Faraday rotation angle. At this time, Faraday rotation angles were measured for light source wavelengths of 633 nm, 1064 nm and 1303 nm, respectively. The results are shown in Table 1.

TABLE 1

| | x | y | z | Compositional formula | Cracks | Transparency | Faraday rotation angle/degrees | | |
|---|---|---|---|---|---|---|---|---|---|
| | | | | | | | 633 nm | 1064 nm | 1303 nm |
| Ex. 1 | 0.04 | 0.13 | 0.1 | $(Tb_{2.96}Sc_{0.04})(Sc_{1.87}Al_{0.13})Al_3O_{11.9}$ | No | Transparent | 73.8 | 21.5 | 13.4 |
| Ex. 2 | 0.06 | 0.09 | 0.1 | $(Tb_{2.94}Sc_{0.06})(Sc_{1.91}Al_{0.09})Al_3O_{11.9}$ | No | Transparent | 75.1 | 21.9 | 14.0 |
| Ex. 3 | 0.09 | 0.03 | 0.1 | $(Tb_{2.91}Sc_{0.09})(Sc_{1.97}Al_{0.03})Al_3O_{11.9}$ | No | Transparent | 73.5 | 21.4 | 13.2 |
| Ex. 4 | 0.01 | 0.15 | 0.2 | $(Tb_{2.99}Sc_{0.01})(Sc_{1.85}Al_{0.15})Al_3O_{11.8}$ | No | Transparent | 73.2 | 21.2 | 12.8 |
| Comp. Ex. 1 | 0 | 0.15 | 0.2 | $Tb_3(Sc_{1.85}Al_{0.15})Al_3O_{11.8}$ | Yes | Transparent | 72.8 | 21.0 | 12.7 |

According to the results shown in Table 1, the single crystals of Examples 1 to 4 were found to have transparency and be able to adequately inhibit the formation of cracks during cutting. In contrast, although the single crystal of Comparative Example 1 was transparent, it was found to be subject to the formation of cracks during cutting.

On the basis of the above, the garnet-type single crystal of the present invention was confirmed to have transparency and enable the formation of cracks to be adequately inhibited.

EXPLANATION OF REFERENCE NUMERALS

1 Polarizer
2 Analyzer
3 Faraday rotator
10 Optical isolator
100 Laser processing machine

The invention claimed is:

1. A garnet-type single crystal represented by the following general formula:

$$(Tb_{3-x}Sc_x)(Sc_{2-y}Al_y)Al_3O_{12-z} \quad (1)$$

wherein, x satisfies 0<x<0.1,
wherein, y satisfies 0≤y≤0.2, and
wherein, z satisfies 0≤z≤0.3.

2. The garnet-type single crystal according to claim 1, which is used for a Faraday rotator.

3. The garnet-type single crystal according to claim 1, wherein x, y and z satisfy the formulas indicated below in the general formula (1):
0.05≤x≤0.07
0.07≤y≤0.11
0.08≤z≤0.12.

4. The garnet-type single crystal according to claim 2, wherein x, y and z satisfy the formulas indicated below in the general formula (1):
0.05≤x≤0.07
0.07≤y≤0.11
0.08≤z≤0.12.

5. An optical isolator having a Faraday rotator, wherein the Faraday rotator is formed of the garnet-type single crystal according to claim 1.

6. An optical isolator, comprising
the garnet-type single crystal according to claim 2.

7. A laser processing machine having the optical isolator according to claim 5.

8. A laser processing machine having the optical isolator according to claim 6.

* * * * *